(12) United States Patent
Li et al.

(10) Patent No.: US 9,704,951 B2
(45) Date of Patent: Jul. 11, 2017

(54) APPARATUS AND METHOD FOR MAGNETIC-FIELD GUIDED METAL-ASSISTED CHEMICAL ETCHING

(71) Applicant: The Board of Trustees of the University of Illinois, Urbana, IL (US)

(72) Inventors: Xiuling Li, Champaign, IL (US); Weidong Zhou, Southlake, TX (US); Wen Huang, Champaign, IL (US)

(73) Assignees: The Board of Trustees of the University of Illinois, Urbana, IL (US); Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 14/541,765

(22) Filed: Nov. 14, 2014

(65) Prior Publication Data
US 2015/0137321 A1   May 21, 2015

Related U.S. Application Data

(60) Provisional application No. 61/904,899, filed on Nov. 15, 2013.

(51) Int. Cl.
| | | |
|---|---|---|
| *C03C 15/00* | (2006.01) | |
| *H01L 21/461* | (2006.01) | |
| *H01L 29/06* | (2006.01) | |
| *G02B 1/00* | (2006.01) | |
| *H01L 21/306* | (2006.01) | |
| *H01L 21/67* | (2006.01) | |

(52) U.S. Cl.
CPC ............ *H01L 29/0665* (2013.01); *G02B 1/00* (2013.01); *H01L 21/30604* (2013.01); *H01L 21/67086* (2013.01)

(58) Field of Classification Search
CPC .......... H01L 29/0665; H01L 21/30604; H01L 21/67086; G02B 1/00
USPC ......... 438/460, 745, 57, 700, 728, 732, 750; 216/83, 106
See application file for complete search history.

(56) References Cited

U.S. PATENT DOCUMENTS

| | | | |
|---|---|---|---|
| 6,790,785 B1 | 9/2004 | Li et al. | |
| 7,173,507 B2 * | 2/2007 | Ries .................. | A61B 1/00158 335/299 |
| 8,452,377 B2 * | 5/2013 | Reinschke ............. | A61B 34/73 335/299 |

(Continued)

OTHER PUBLICATIONS

Balasundaram, Karthik et al., "Porosity control in metal-assisted chemical etching of degenerately doped silicon nanowires," *Nanotechnology*, 23 (2012) 305304, pp. 1-7.

(Continued)

*Primary Examiner* — Nadine Norton
*Assistant Examiner* — Christopher Remavege
(74) *Attorney, Agent, or Firm* — Brinks Gilson & Lione

(57) ABSTRACT

A magnetic field-guided method of metal-assisted chemical etching comprises immersing a structure that comprises a two-dimensional magnetic pattern layer on a surface thereof in an etchant solution. The magnetic pattern layer sinks into the structure as portions of the structure directly under the magnetic pattern layer are etched. A programmable magnetic field H(t) is applied to the structure during etching to guide the sinking of the magnetic pattern layer, thereby controlling the etching of the structure in three dimensions.

14 Claims, 6 Drawing Sheets

(56) References Cited

U.S. PATENT DOCUMENTS

| | | | | |
|---|---|---|---|---|
| 2003/0006008 | A1* | 1/2003 | Horioka | H01J 37/32623 156/345.46 |
| 2008/0272873 | A1* | 11/2008 | Reinschke | A61B 1/00158 335/299 |
| 2010/0248449 | A1* | 9/2010 | Hildreth | B81C 1/00071 438/460 |
| 2011/0054254 | A1* | 3/2011 | Reinschke | A61B 34/73 600/118 |
| 2012/0034707 | A1* | 2/2012 | Datta | B82B 1/00 436/501 |
| 2014/0191371 | A1* | 7/2014 | Joseph | H01L 21/30604 257/618 |
| 2014/0256078 | A1* | 9/2014 | Jin | B81C 1/00515 438/57 |

OTHER PUBLICATIONS

Balasundaram, Karthik et al., "Photonic crystal membrane reflectors by magnetic field-guided metal-assisted chemical etching," *Applied Physics Letters*, 103, 21 (2013) pp. 214103-1-214103-4.
Boardman, Allan D. et al., "Active and tunable metamaterials," *Laser Photonics Rev.*, 5, 2 (2011) pp. 287-307.
Bonini, Massimo et al., "Nanostructures for magnetically triggered release of drugs and biomolecules," *Current Opinion in Colloid & Interface Science*, 18 (2013) pp. 459-467.
Chanda, Debashis et al., "Large-area flexible 3D optical negative index metamaterial formed by nanotransfer printing," *Nature Nanotechnology*, 6, (2011) pp. 402-407.
Chang, Shih-Wei et al., "Densely Packed Arrays of Ultra-High-Aspect-Ratio Silicon Nanowires Fabricated using Block-Copolymer Lithography and Metal-Assisted Etching," *Adv. Funct. Mater.*, 19 (2009) pp. 2495-2500.
Chen, Li et al., "Polarization and angular dependent transmissions on transferred nanomembrane Fano filters," *Optics Express*, 17, 10 (2009) pp. 8396-8406.
Chern, Winston et al., "Nonlithographic Patterning and Metal-Assisted Chemical Etching for Manufacturing of Tunable Light-Emitting Silicon Nanowire Arrays," *Nano Letters*, 10 (2010) pp. 1582-1588.
Chun, Ik Su et al., "Nanoscale three dimensional pattern formation in light emitting porous silicon," *Applied Physics Letters*, 92 (2008); pp. 19113-1-19113-3.
DeJarld, Matt et al., "Formation of High Aspect Ratio GaAs Nanostructures with Metal-Assisted Chemical Etching," *Nano Letters*, 11 (2011) pp. 5259-5263.
Ding, Y. et al., "Resonant leaky-mode spectral-band engineering and device applications," *Optics Express*, 12, 23 (2004) pp. 5661-5674.
Dowdy, Ryan et al., "Realization of Unidirectional Planar GaAs Nanowires on GaAs (110) Substrates," *IEEE Electron Device Letters*, 33, 4 (2012) pp. 522-524.
Dowdy, Ryan S. et al., "Relationship between planar GaAs nanowire growth direction and substrate orientation," *Nanotechnology*, 24 (2013) 035304, pp. 1-6.
Ergin, Tolga et al., "Three-Dimensional Invisibility Cloak at Optical Wavelengths," *Science*, 328 (2010) pp. 337-339.
Fan, Shanhui et al., "Analysis of guided resonances in photonic crystal slabs," *Physical Review B*, 65, 23 (2002) pp. 235112-1-235112-8.
Gabrilli, Lucas H. et al., "Silicon nanostructure cloak operating at optical frequencies," *Nature Photonics*, 3 (2009) pp. 461-463.
Gansel, Justyna K. et al., "Gold Helix Photonic Metamaterial as Broadband Circular Polarizer," *Science*, 235 (2009) pp. 1513-1515.
Geng, Xuewen et al., "Monodisperse GaN nanowires prepared by metal-assisted chemical etching with in situ catalyst deposition," *Electrochemistry Communications*, 19 (2012) pp. 39-42.
Geyer, Nadine et al., "Sub-20 nm Si/Ge Superlattice Nanowires by Metal-Assisted Etching," *Nano Letters*, 9, 9 (2009) pp. 3106-3110.

Grier, David G., "A revolution in optical manipulation," *Nature*, 424 (2003) pp. 810-816.
Grzelczak, Marek et al., "Directed Self-Assembly of Nanoparticles," *ACS Nano*, 4, 7 (2010) pp. 3591-3605.
Hildreth, Owen James et al., "Effect of Catalyst Shape and Etchant Composition on Etching Direction in Metal-Assisted Chemical Etching of Silicon to Fabricate 3D Nanostructures," *ACS Nano*, 3, 12 (2009) pp. 4033-4042.
Hu, Evelyn L. et al., "Dry Etch Damage in III-V Semiconductors," *Microelectronic Engineering*, 35 (1997) pp. 23-28.
Hu, Huan et al., "Nano-Electro-Mechanical Systems Fabricated using Tip-based Nanofabrication," *Proc. of SPIE*, 8725 (2013) pp. 87250P-1-87250P-6.
Huang, Wen et al., "On-Chip Inductors with Self-Rolled-Up $SiN_x$ Nanomembrane Tubes: A Novel Design Platform for Extreme Miniaturization," *Nano Letters*, 12 (2012) pp. 6283-6288.
Huang, Zhipeng et al., "Metal-Assisted Chemical Etching of Silicon: A Review," *Advanced Materials*, 23 (2011) pp. 285-308.
Kiraly, Brian et al., "Multifunctional porous silicon nanopillar arrays: antireflection, superhydrophobicity, photoluminescence, and surface-enhanced Raman scattering," *Nanotechnology*, 24 (2013) 245704, pp. 1-10.
Lapine, Mikhail et al., "Metamaterials with conformational nonlinearity," *Scientific Reports*, 1,138 (2011) pp. 1-4.
Li, Rui et al., "Ag-Assisted Electrochemical Etching of Silicon for Antireflection in Large Area Crystalline Thin Film Photovoltaics," *Photovoltaic Specialists Conference (PVSC)*, $38^{th}$ IEEE (2012) pp. 002563-002565.
Li, X. et al., "Metal-assisted chemical etching in $HF/H_2O_2$ produces porous silicon," *Applied Physics Letters*, 77, 16 (2000) pp. 2572-2574.
Li, Xiuling, "Metal assisted chemical etching for high aspect ratio nanostructures: A review of characteristics and applications in photovoltaics," *Current Opinion in Solid State and Materials Science*, 16 (2012) pp. 71-81.
Li, Xiuling, "Self-rolled-up microtube ring resonators: a review of geometrical and resonant properties," *Advances in Optics and Photonics*, 3 (2011) pp. 366-387.
Li, Xiuling, "Strain induced semiconductor nanotubes: from formation process to device applications," *J. Phys. D: Appl. Phys.*, 41 (2008) 193001, pp. 1-12.
Lianto, Prayudi et al., "Vertical etching with isolated catalysts in metal-assisted chemical etching of siliconH," *Nanoscale*, 4 (2012) pp. 7532-7539.
Liu, Na et al., "Three-dimensional photonic metamaterials at optical frequencies," *nature materials*, 7 (2008) pp. 31-37.
Liu, Yihua et al., "Self-Terminating Growth of Platinum Films by Electrochemical Deposition," *Science*, 338 (2012) pp. 1327-1330.
Lu, Ling et al., "Weyl Points and Line Nodes in Gapless Gyroid Photonic Crystals," and "Supplementary Information," *Nature Photonics*, 7, (2013) pp. 294-299 and pp. 1-2.
Lyon, Jennifer L. et al., "Synthesis of Fe Oxide Core/Au Shell Nanoparticles by Iterative Hydroxylamine Seeding," *Nano Letters*, 4, 4 (2004) pp. 719-723.
Meitl, Matthew A. et al., "Transfer printing by kinetic control of adhesion to an elastomeric stamp," *Nature Materials*, 5 (2006) pp. 33-38.
Miao, Xin et al., "Scalable Monolithically Grown AlGaAs—GaAs Planar Nanowire High-Electron-Mobility Transistor," *IEEE Electron Device Letters*, 32, 9 (2011) pp. 1227-1229.
Mille, Christian et al., "Inorganic chiral 3-D photonic crystals with bicontinuous gyroid structure replicated from butterfly wing scales," *Chem. Commun.*, 47 (2011) pp. 9873-9875.
Mohseni, Parsian K. et al., "GaAs pillar array-based light emitting diodes fabricated by metal-assisted chemical etching," *J. Appl. Phys.*, 114, 064909 (2013) pp. 1-7.
Nelson, Erik C. et al., "Epitaxial growth of three-dimensionally architectured optoelectronic devices," *Nature Materials*, 10 (2011) pp. 676-681.
Oh, Young et al., "Magnetically Guided Nano-Micro Shaping and Slicing of Silicon," *Nano Letters*, 12 (2012) pp. 2045-2050.
Orilall, M. Christopher et al., "Block copolymer based composition and morphology control in nanostructured hybrid materials for

(56) References Cited

OTHER PUBLICATIONS energy conversion and storage: solar cells, batteries, and fuel cells," *Chem. Soc. Rev.*, 40 (2011) pp. 520-535.
Qiang, Zexuan et al., "Fano filters based on transferred silicon nanomembranes on plastic substrates," *Applied Physics Letters*, 93, 061106 (2008) pp. 1-3.
Saranathan, Vinodkumar et al., "Structure, function, and self-assembly of single network gyroid (/4$_1$32) photonic crystals in butterfly wing scales," *PNAS*, 107, 26 (2010) pp. 11676-11681.
Shin, Jae Cheol et al., "Characteristics of Strain-Induced In$_x$Ga$_{1-x}$As Nanowires Grown on Si(111) Substrates," *Crystal Growth & Design*, 12 (2012) pp. 2994-2998.
Shin, Jae Cheol et al., "Experimental Study of Design Parameters in Silicon Micropillar Array Solar Cells Produced by Soft Lithography and Metal-Assisted Chemical Etching," *IEEE Journal of Photovoltaics*, 2, 2 (2012) pp. 129-133.
Shin, Jae Cheol et al., "In$_x$Ga$_{1-x}$As Nanowires on Silicon: One-Dimensional Heterogeneous Epitaxy, Bandgap Engineering, and Photovoltaics," *Nano Letters*, 11 (2011) pp. 4831-4838.
Shin, Jae Cheol et al., "Sub-100 nm Si nanowire and nano-sheet array formation by MacEtch using a non-lithographic InAs nanowire mask," *Nanotechnology*, 23 (2012) 305305, pp. 1-6.
Soukoulis, Costas M. et al., "Optical Metamaterials—More Bulky and Less Lossy," *Science*, 330 (2010) pp. 1633-1634.
Sun, Lei et al., "12-GHz Thin-Film Transistors on Transferrable Silicon Nanomembranes for High-Performance Flexible Electronics," *Small*, 6, 22 (2010) pp. 2553-2557.
Sweeney, Allison et al., "Polarized light as a butterfly mating signal," *Nature*, 423 (2003) pp. 31-32.
Switzer, Jay A., "Atomic Layer Electrodeposition," *Science*, 338 (2012) p. 1300.
Valentine, Jason et al., "Three-dimensional optical metamaterial with a negative refractive index," *Nature*, 455 (2008) pp. 376-380.
Vignolini, Silvia et al., "A 3D Optical Metamaterial Made by Self-Assembly," *Adv. Mater.*, 24 (2012) pp. OP23-0P27.
Wang, Yuehui, et al., "A Review on Inorganic Nanostructure Self-Assembly," *Journal of Nanoscience and Nanotechnology*, 10 (2010) pp. 1563-1583.
Wu, Banqiu et al., "High aspect ratio silicon etch: A review," *J. Appl. Phys.*, 108, 051101 (2010) pp. 1-20.
Xiao, Shumin et al., "Loss-free and active optical negative-index metamaterials," *Nature*, 466 (2010) pp. 735-738.
Yang, Hongjun et al., "Broadband Membrane Reflectors on Glass," *IEEE Photonics Technology Letters*, 24, 6 (2012) pp. 476-478.
Yang, Hongjun et al., "Transfer-printed stacked nanomembrane lasers on silicon," *Nature Photonics*, 6 (2012) pp. 615-620.
Yu, Nanfang et al., "Semiconductor lasers with integrated plasmonic polarizers," *Applied Physics Letters*, 94, 151101 (2009) pp. 1-3.
Zheludev, Nikolay I., "The Road Ahead for Metamaterials," *Science*, 328 (2010) pp. 582-583.
Zhou, Weidong et al., "Flexible photonic-crystal Fano filters based on transferred semiconductor nanomembranes," *J. Phys. D: Appl. Phys.*, 42 (2009) 234007, pp. 1-11.

\* cited by examiner

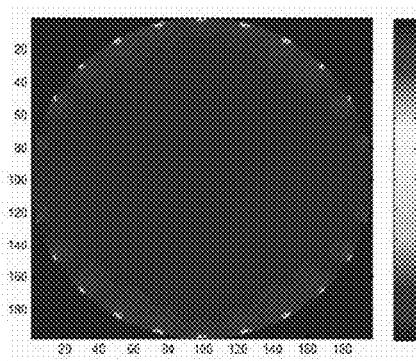 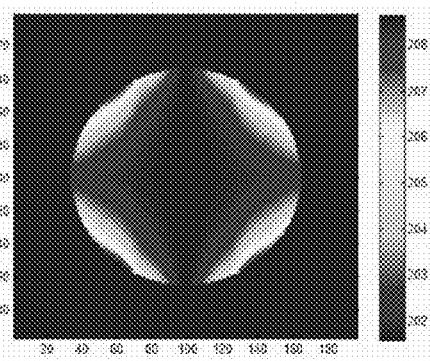
FIG. 6A  FIG. 6B
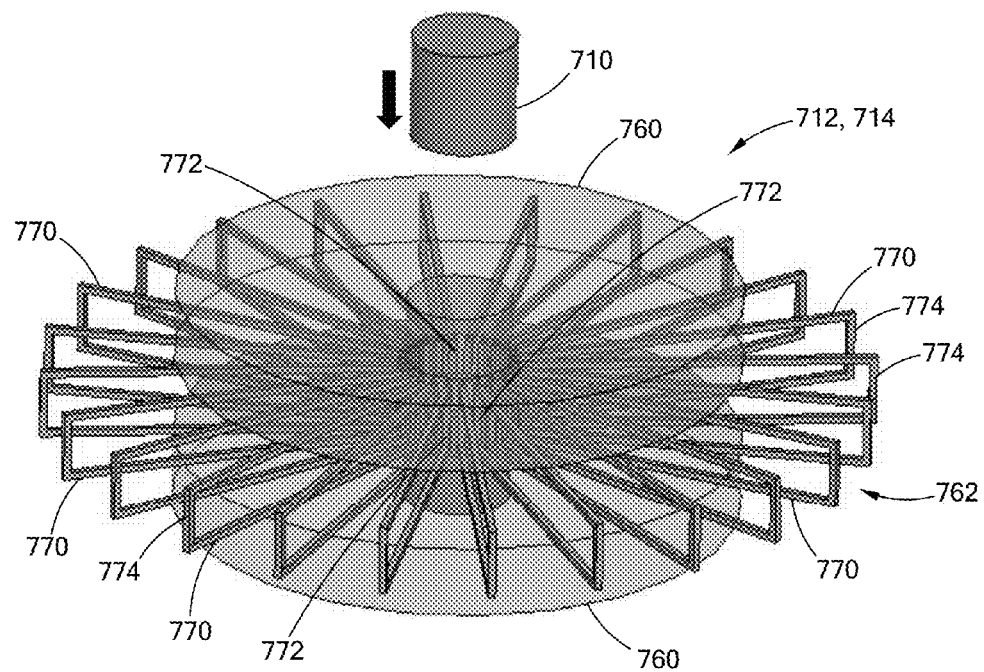
FIG. 7

APPARATUS AND METHOD FOR MAGNETIC-FIELD GUIDED METAL-ASSISTED CHEMICAL ETCHING

RELATED APPLICATIONS

The present patent document claims the benefit of priority under 35 U.S.C. §119(e) to U.S. Provisional Patent Application Ser. No. 61/904,899, which was filed on Nov. 15, 2013, and is hereby incorporated by reference in its entirety.

TECHNICAL FIELD

The present disclosure is related generally to metal-assisted chemical etching (MacEtch) and more particularly to magnetic-field assisted chemical etching.

BACKGROUND

Nanostructures formed from semiconducting materials are becoming more prevalent. Many different fabrication methods can be used to produce nanostructures, but they generally have not been able to offer complete control over the pattern and quality of the nanostructures in an affordable and timely manner. One of the most popular methods is reactive ion etching of a patterned substrate. However, this can result in intense damage to the crystal structure and surface morphology. Since many semiconducting applications are very sensitive to defects within the material, it is important to reduce them whenever possible. One method which is becoming increasingly used is metal-assisted chemical etching (MacEtch).

Metal-assisted chemical etching offers a method of etching silicon by patterning a silicon surface with a layer of metal. The metal acts as a catalyst for etching the silicon surface directly beneath it when exposed to an oxidizing agent (e.g., $H_2O_2$) and an acid (e.g., HF). Metal assisted chemical etching can produce vertical nanowires of high aspect ratios in silicon (e.g., see U.S. Patent Application Publication 2011/0263119, entitled "Method of Forming Nanoscale Three-Dimensional Patterns in a Porous Material," which is hereby incorporated by reference in its entirety). Since it is a wet etch technique, MacEtch can be carried out economically in large quantities in comparison with popular dry etch methods, which may require a vacuum or plasma.

BRIEF SUMMARY

An apparatus for magnetic field-guided metal-assisted chemical etching includes: (a) an etching chamber for containing an etchant and a structure to be etched, where the etching chamber includes an origin of x-, y- and z-axes, and (b) a three-dimensional configuration of magnets surrounding the etching chamber. The magnets may comprise electromagnets.

A magnetic field-guided method of metal-assisted chemical etching comprises immersing a structure that includes a two-dimensional magnetic pattern layer on a surface thereof in an etchant solution. The magnetic pattern layer sinks into the structure as portions of the structure directly under the magnetic pattern layer are etched. A programmable magnetic field H(t) is applied to the structure during etching to guide the sinking of the magnetic pattern layer, thereby controlling the etching of the structure in three dimensions.

BRIEF DESCRIPTION OF THE DRAWINGS

FIGS. 6A and 6B show the magnetic field distribution in the x-z plane (3-in. area) and in the x-y plane (2-in. area), respectively, for the cage coil magnet assembly of FIG. 5.

FIG. 7 is a schematic showing an exemplary configuration of magnets for applying a programmable magnetic field during etching; the configuration includes a pair of ring electromagnets positioned in opposition to each other along the z-axis and a cage coil magnet assembly radially positioned about the z-axis

DETAILED DESCRIPTION

A magnetic field-assisted programmable chemical etching process has been developed for the controlled fabrication of complex three-dimensional (3D) nano- and microscale structures, such as optical metamaterials.

Figure 1:
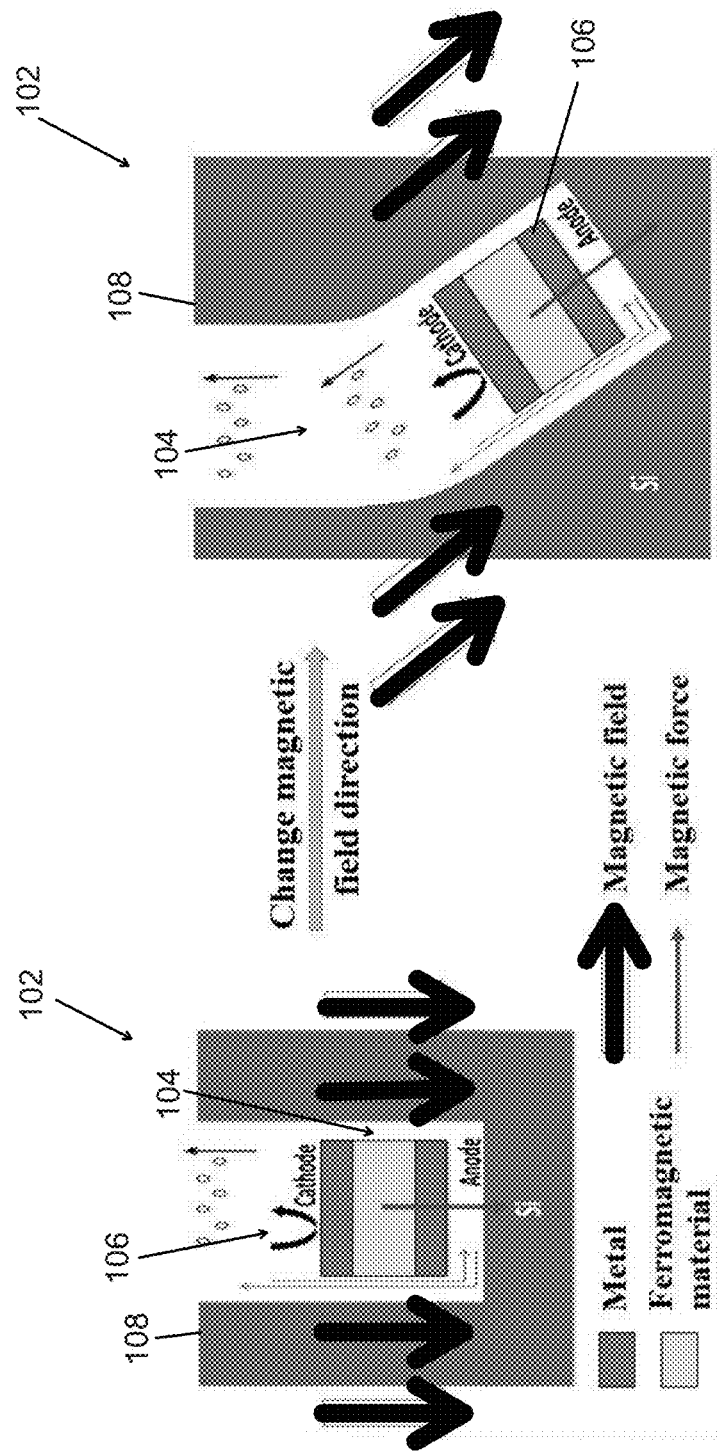
FIG. 1 is a schematic of magnetic field-assisted programmable chemical etching.

Referring to FIG. 1, a structure 102 that includes a two-dimensional (2D) magnetic pattern layer 106 on a surface 108 thereof is immersed in an etchant solution 104 to induce etching. The structure 102 may comprise a semiconducting material, such as silicon. The magnetic pattern layer 106 sinks into the structure 102 as portions of the structure 102 directly under the magnetic pattern 106 are chemically etched via metal-assisted chemical etching (MacEtch), as described further below. During the etching, a programmable magnetic field is applied to the structure 102 to guide the sinking of the magnetic pattern layer 106, thereby controlling the etching of the structure 102 in three dimensions. The programmable magnetic field also serves to enhance adhesion between the magnetic pattern layer 106 and the underlying structure 102, thereby preventing or minimizing delamination, which can reduce the etch rate.

The magnetic pattern layer 106 may have a composite structure including a ferromagnetic material, which is responsive to the magnetic field, and a metal catalyst, which promotes chemical etching of portions of the structure by the etchant. Preferably, the metal catalyst partially or fully encapsulates the ferromagnetic material. An exemplary magnetic pattern layer 106 is shown in FIG. 1, and other examples are discussed in reference to FIGS. 4A-4C.

Applying a programmable magnetic field to the structure may comprise controlling the magnitude and direction of electric current supplied to electromagnets that surround the structure in a desired three-dimensional (3D) configuration. X-, y- and z-axes may be defined with respect to the structure, or with respect to an etching chamber configured to contain the structure and the etchant solution. The z-axis is understood to be aligned with the vertical direction as defined by the force of gravity. The primary advantage of an electromagnet compared to a permanent magnet is that the magnetic field can be rapidly manipulated over a wide range by controlling the amount of electric current. The 3D configuration of electromagnets may be substantially symmetric about the structure to be etched to promote achievement of a uniform magnetic field. Each electromagnet may comprise a ferromagnetic core surrounded by numerous turns of an electrically conductive wire. In some embodiments, the electromagnets may comprise superconducting electromagnets formed with superconductive wire. Alternatively, the electromagnets may comprise conductive strips arranged to form a cage coil magnet assembly, as described further below.

Figure 2A:
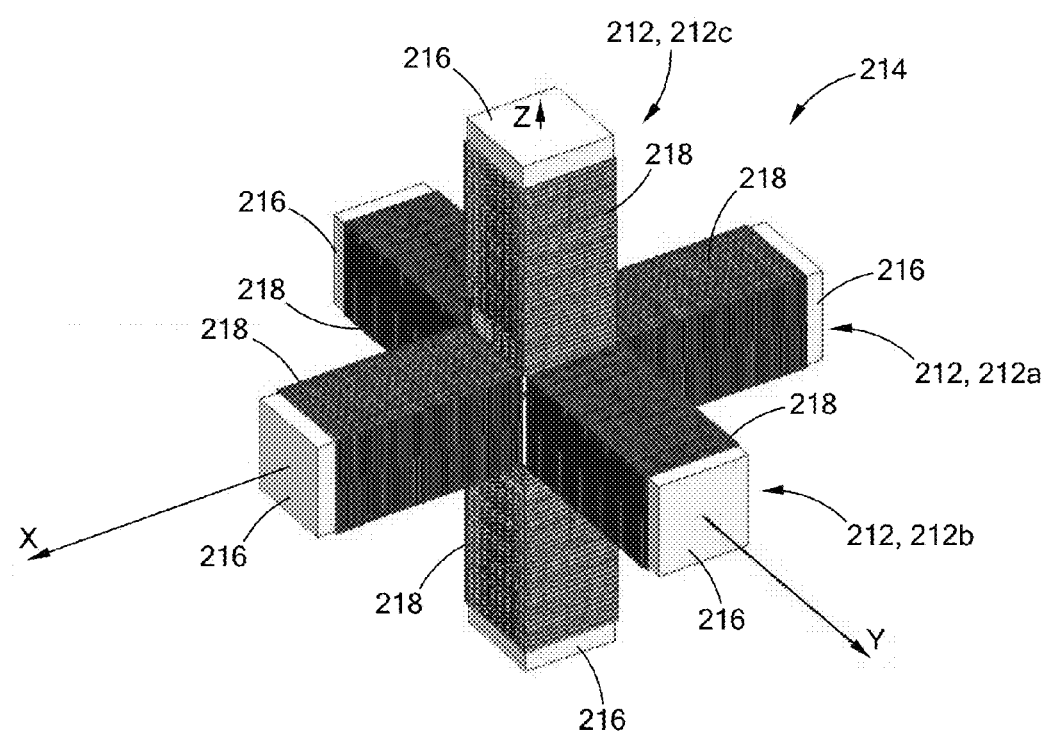
FIG. 2A is a schematic showing an exemplary configuration of magnets for applying a programmable magnetic field during etching.
Figure 2B:
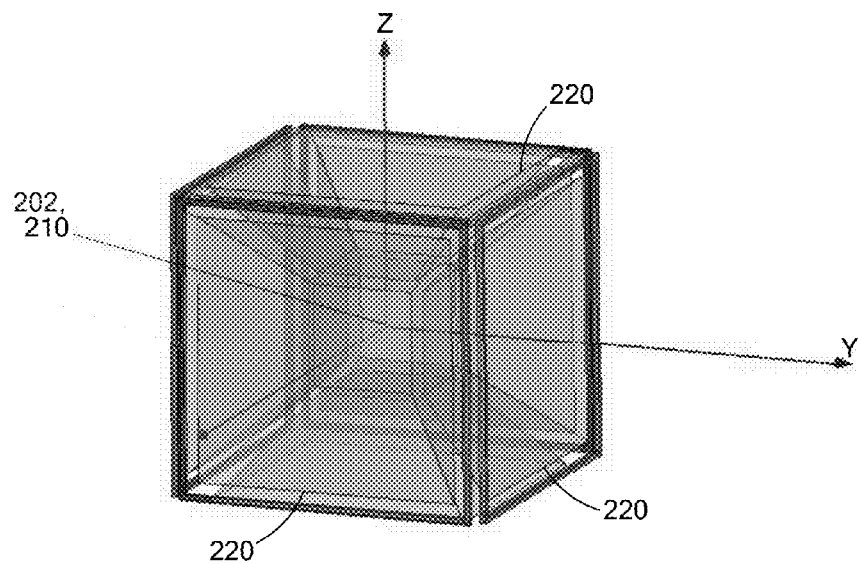
FIG. 2B shows a partial view schematic of ends of the electromagnets of FIG. 2A positioned along x-, y- and z-axes surrounding the etching chamber.

FIGS. 2A and 2B show a first exemplary 3D configuration 214 of magnets 212 for applying a programmable magnetic field that allows for three-dimensional control over etching. The magnets 212 surrounding the structure 202 include a first pair of magnets 212a positioned on opposing sides of the etching chamber 210 along the x-axis, a second pair of magnets 212b positioned on opposing sides of the etching chamber 210 along the y-axis, and a third pair of magnets 212c positioned on opposing sides of the etching chamber 210 along the z-axis. Preferably, the magnets 212 are electromagnets, which may comprise a ferromagnetic core 216 with multiple turns of an electrically conductive wire 218, as shown in FIG. 2A. The ferromagnetic core 216 may have a cubic or rectangular prismatic shape with a tapered end 220 positioned adjacent to the etching chamber 210, as shown in FIG. 2B.

Figure 3:
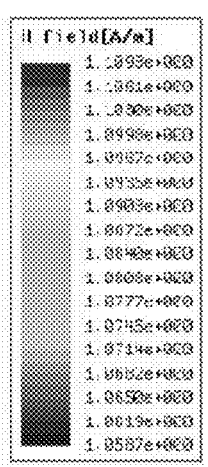
FIG. 3 shows a simulated magnetic field distribution in a y-z plane cutting through the center of the etching chamber for the configuration of magnets shown FIGS. 2A-2B.
Figure 3:
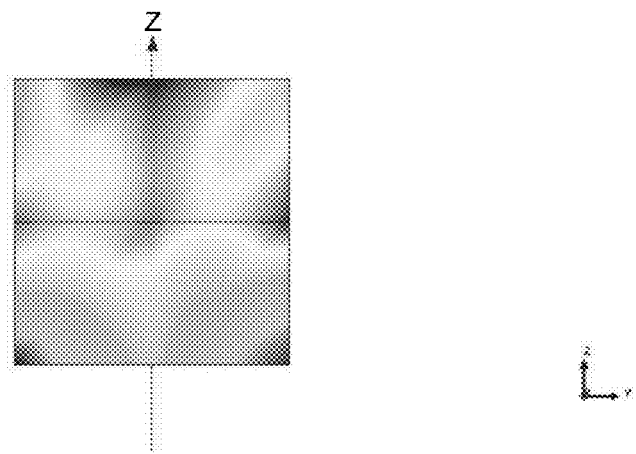

Each electromagnet can be independently turned on and off. Electric current may be supplied to each electromagnet with the desired polarity (direction) and magnitude. For example, each pair of electromagnets 212 facing each other along the x, y, and z axes may be supplied with DC current of opposite polarity but of the same magnitude. By tuning the magnitude and polarity of the current supplied into each pair of electromagnets, the direction of the magnetic field may be controlled and may be substantially uniform over the desired region (e.g., the volume of the etching chamber or, more specifically, all or a portion of the structure to be etched). It may be advantageous for the width of each electromagnet to be at least about 10 times larger than that of the structure to be etched in order to obtain a relatively uniform magnetic field over the structure. A simulated magnetic field distribution for the y-z plane passing through the etching chamber 210 is shown in FIG. 3 for the exemplary electromagnet configuration 214 of FIGS. 2A and 2B. The field distribution data here and elsewhere in this disclosure were obtained by a finite element method (FEM) analysis using Ansys HFSS (High Frequency Structure Simulator), a commercially available software program.

As would be recognized by one of ordinary skill in the art, magnetic field is a vector having x, y, z components that may be written in Cartesian coordinates as $\vec{H} = \vec{H}_x + \vec{H}_y + \vec{H}_z = \vec{a}_x H_x(x,y,z) + \vec{a}_y H_y(x,y,z) + \vec{a}_z H_z(x,y,z)$ where $\vec{a}_x, \vec{a}_y, \vec{a}_z$ are unit vectors along +x, +y, and +z directions, respectfully. By controlling the value of scalars $H_x(x,y,z)$, $H_y(x,y,z)$, $H_z(x,y,z)$, it is possible to obtain a magnetic field with a desired direction and strength. The motion of the magnetic pattern (e.g., sinking into the structure) occurs as a function of time and may be expressed as M(t). The magnetic field is also a function of time and may be expressed as H(t). If the desired motion M(t) is known, it is possible to determine the requisite H(t) by considering the etching parameters. H(t) can be expressed as $\vec{H}(t) = \vec{H}_x(t) + \vec{H}_y(t) + \vec{H}_z(t) = \vec{a}_x H_x(t) + \vec{a}_y H_y(t) + \vec{a}_z H_z(t)$. Because $\vec{H}_x(t), \vec{H}_y(t), \vec{H}_z(t)$ are proportional to the current amplitude, a signal control sub-system may be designed to adjust the current amplitude ratio of each pair according to $\vec{H}_x(t), \vec{H}_y(t), \vec{H}_z(t)$. Accordingly, a programmable magnetic field may be applied to the structure to control etching in three-dimensions.

The magnetic pattern layer 106 that is transferred into the structure 102 during magnetically-guided etching may have any 2D size and shape that can be formed by a patterning method known in the art. Exemplary patterning methods include lithography and etching, for example, and stamping, the latter of which is described in U.S. Patent Application Publication 2013/0052762, entitled "Method of Forming an Array of High Aspect Ratio Semiconductor Nanostructures," which is hereby incorporated by reference in its entirety. The pattern may have nanoscale and/or microscale features, where nanoscale features may be considered to be from about 1 nm to about 100 nm in lateral size, and microscale (or submicron) features may be considered to be about 1 micron or less in lateral size.

The magnetic pattern layer may include a plurality of discrete features, such as disks arranged in a 2D array. Alternatively, the magnetic pattern layer may be continuous across the surface of the structure, taking the form, for example, of a patterned thin film containing a 2D array of holes, or a curvilinear strip having a spiral or other 2D geometry. During the magnetically guided etching process, the 2D magnetic pattern layer sinks into the structure along a predetermined path to produce an etched structure that has, at any given etched depth, a 2D geometry complementary to that of the magnetic pattern layer.

As described above, the magnetic pattern layer may have a composite structure including a ferromagnetic material and a metal catalyst that partially or fully encapsulates the ferromagnetic material. The ferromagnetic material responds to the magnetic field and the metal catalyst promotes chemical etching. The metal catalyst may be a metal or alloy including one or more of Ag, Au, Pt, Ti, Al and Cr while the ferromagnetic material may be a metal or alloy including one or more of Fe, Ni, Co, Mn, Cr, Gd or Dy.

The magnetic pattern layer may be formed by depositing and then patterning a thin film comprising one or more layers using methods known in the art. For example, physical vapor deposition (e.g., sputtering or evaporation) may be used, where the metal catalyst and the ferromagnetic material may be deposited as different sublayers of the thin film on the structure to be etched. Commercially available deposition systems may be used to carry out the deposition process. Generally, the thickness of the deposited thin film lies in the range of from about 5 nm to about 500 nm, or from about 50 nm to about 200 nm. After deposition of the thin film comprising the metal catalyst and the ferromagnetic material, conventional patterning methods (e.g., lithography and etching) may be employed to form the desired 2D geometry of the magnetic pattern layer.

Figures 4A, 4B, 4C:
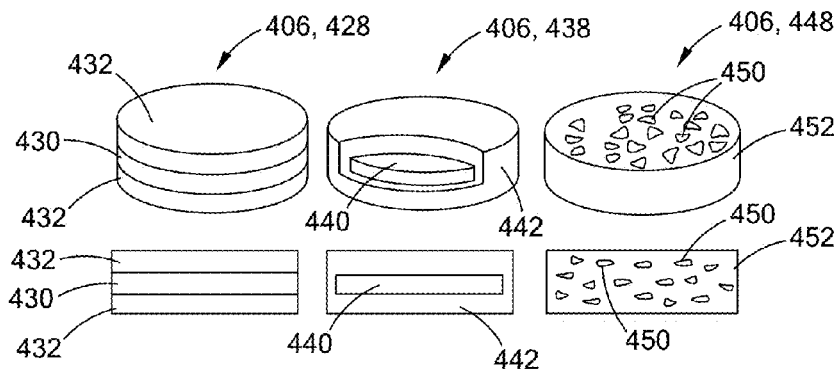
FIGS. 4A-4C are schematics showing three exemplary composite structures of a magnetic pattern layer that comprises one or more circular disks.

Three exemplary composite structures of an exemplary magnetic pattern layer are illustrated in FIGS. 4A-4C in perspective view (top) and in cross-sectional view (bottom). In these examples, the magnetic pattern 406 comprises one or more circular disks, each capable of chemically etching a tunnel into the structure. FIG. 4A shows an exemplary tri-layer composite structure 428 with a ferromagnetic material layer 430 sandwiched between and partially encapsulated within metal catalyst layers 432. FIG. 4B shows a fully encapsulated tri-layer composite structure 438 where a ferromagnetic material layer 440 is embedded within a metal catalyst shell 442. FIG. 4C shows an alternative composite structure 448 where discrete particles 450 of the ferromagnetic material are distributed throughout and may be fully encapsulated by the metal catalyst 452.

It may be advantageous for the programmable magnetic field to have a spatial variation of less than about 5% over the structure being etched. If, for example, it is desired to produce an etched structure comprising a large array of identical etched features, the programmable magnetic field is preferably sufficiently uniform to produce etched features having the desired feature-to-feature uniformity over the entirety of the array. The uniformity of the programmable magnetic field may depend on the configuration, size and other characteristics of the magnets as well as the motion of the structure being etched. During application of the magnetic field, the structure may be rotated about the z-axis and/or translated to improve the uniformity of the magnetic field exposure.

Since the magnetic field strength is inversely proportional to distance to the third power, it may be challenging to achieve the desired field uniformity for large-area or large-volume structures (e.g., semiconductor wafers). Depending on the magnetic field strength and uniformity requirements, the size of the ferromagnetic core and number of windings may be beneficially increased. Also, the purity of the ferromagnetic core, which affects magnetic permittivity, and thermal insulation of the wires, which influences current carrying capacity, may need to be considered. Suitable electromagnets may be obtained from commercial vendors or fabricated using methods known in the art. To achieve a uniform magnetic field for larger wafer sizes, the footprint and weight of conventional electromagnets with iron cores can be significant. Accordingly, alternative electromagnet configurations for scaling magnetic field-guided MacEtch towards larger wafer sizes are considered.

It is contemplated that the magnetic pattern layer may be designed to compensate for a nonuniform magnetic field distribution or to enhance the uniformity of the magnetic field distribution in the etching chamber. For example, if the magnetic field distribution of a particular magnet configuration is known, the magnetic pattern layer may be designed to have a predetermined spatial distribution of the ferromagnetic material, where regions of the magnetic pattern layer exposed to a lower magnetic field may include a larger amount of the ferromagnetic material, and regions of the magnetic pattern layer exposed to a higher magnetic field may contain a lesser amount of the ferromagnetic material. Referring again to FIGS. 4A and 4B, the amount of the ferromagnetic material may be controlled during fabrication by, for example, increasing or decreasing the thickness of the ferromagnetic material layer. Alternatively, referring to FIG. 4C, the amount and/or size of the embedded ferromagnetic particles may be increased or decreased according to the predetermined magnetic field distribution.

For some applications, a non-uniform magnetic field distribution may be preferred. For example, since the etch rate may depend on the size of the metal catalyst, the magnetic field can be used as another local tuning parameter to compensate for an etch rate difference due to other factors.

Figure 5:
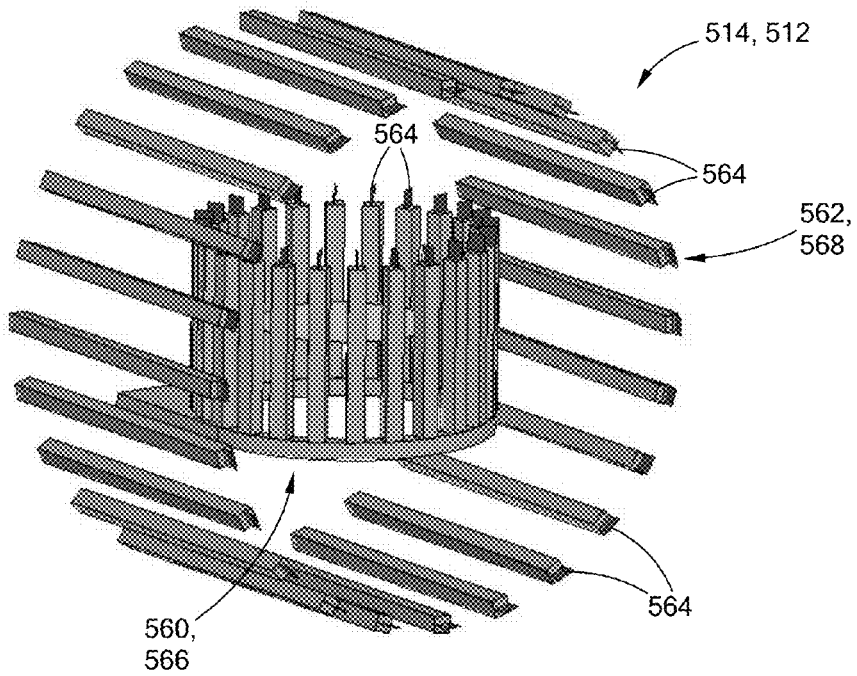
FIG. 5 is a schematic showing an exemplary configuration of magnets for applying a programmable magnetic field during etching; the configuration includes an inner cage coil magnet assembly and an outer cage coil magnet assembly oriented about perpendicular axes (y-axis and z-axis, respectively).

FIG. 5 shows a second exemplary configuration 514 of magnets 512 for applying the programmable magnetic field. In this example, a first (inner) cage coil magnet assembly 560 is disposed inside a second (outer) cage coil magnet assembly 562, which has a larger diameter than the first cage coil magnet assembly 560. The first cage coil magnet assembly 560 is radially positioned about the x-axis or the y-axis (the latter in this example), and the second cage coil magnet assembly 562 is radially positioned about the z-axis. Alternatively, the first cage coil magnet assembly may be radially positioned about the z-axis and the second cage coil magnet assembly may be radially positioned about the x-axis or the y-axis.

A cage coil magnet assembly 560, 562 comprises a hollow, electrically isolated cylinder 566, 568 surrounded by a number of conductive strips 564, which function as electromagnets. The conductive strips 564 may be oriented along the longitudinal axis of the cylinder 566, 568. The separation distance between adjacent strips 564 may be the same about the circumference of the cylinder 566, 568. DC current may be supplied to each strip 564 with a desired magnitude and current direction. If the number of strips 564 is N, then the current supplied to each strip can be calculated as $I_n = I_0 \sin[2\pi*(n-1)/N]$, where n=1, 2, 3, . . . , N, and $I_0$ is the maximum magnitude of current that is fed into the strips. Typically for a cage coil magnet assembly, N≥24.

Referring again to FIG. 5, current flow in the inner cage coil magnet assembly 560 is perpendicular to that in the outer cage coil magnet assembly 562. The inner coil 560 controls the magnetic field in the x-y plane, and the outer coil 562 controls the magnetic field in the x-z plane. FIGS. 6A and 6B show the magnetic field distribution in the x-z plane (3-in. area) and in the x-y plane (2-in. area), respectively. As shown by the distribution plots, the magnetic field is highly uniform throughout the inner and outer cylinders. The uniformity can be further improved by using a larger number of strips.

FIG. 7 shows a third exemplary configuration 714 of magnets 712 for applying the programmable magnetic field. In this example, a pair of ring electromagnets 760 are positioned on opposing sides (surfaces) of the etching chamber 710 (which in this example is a cylindrical etching chamber 710) along one of the x-, y- and z-axes (in this case, the z-axis) and a cage coil magnet assembly 762 is radially positioned about the same axis (in this example, the z-axis). This hybrid design combines the advantages of a conventional electromagnet configuration with the cage coil design. The field in the horizontal (x-y) plane is controlled by the cage coil magnet assembly 762, and the field in the vertical direction (z) is controlled by the pair of ring-shaped electromagnets 760.

As can be seen, there are a plurality of rectangular metal loops 770 surrounding the cylindrical etching chamber 710, where an inner portion 772 of each rectangular loop 770 lies adjacent to the cylindrical chamber 710 in alignment with the longitudinal axis of the chamber 710. The inner portion 772 of each rectangular loop 770 is in contact with the cylindrical etching chamber 710 and serves as a conductive strip of the cage coil magnet assembly 762. The rectangular loops 770 are drawn to show the current flow through the conductive strips. Since the current flow in the inner and outer portions 772, 774 are opposite to each other, there could be a cancelling effect on the magnetic field generated inside the chamber 710; thus, the outer portion 774 of each rectangular loop 770 is preferably positioned far away from the inner portion 772 of the loop 770.

The structure that undergoes etching may comprise any material for which a suitable etchant for metal-assisted chemical etching may be identified. Typically, the structure comprises a semiconducting material such as Si, Ge, GaAs, InAs, InGaAs, or GaN. As indicated above, the magnetic pattern layer includes a metal catalyst that serves as a chemical drill to carve out three-dimensional channels and/or other etched features from the underlying structure. Upon exposure to (or immersion in) a solution that contains an oxidizing agent and an acid, such as hydrogen peroxide ($H_2O_2$) or nitric acid ($HNO_3$) and hydrofluoric acid (HF), the 2D pattern may be transferred into the structure. Material removal occurs directly underneath the metal catalyst due to a rapid catalytic etching reaction at the metal-semiconductor interface. The metal catalyst acts as a local cathode and a catalyst to promote the reduction of the oxidants and to generate free holes ($h^+$) at the metal-semiconductor interface. The magnetic pattern layer travels downward as the semiconductor is removed beneath it, maintaining a metal-semiconductor junction and enabling continuous etching under the metal catalyst.

The material removal, or etching, proceeds from immediately below the magnetic pattern layer in a depth direction (although not necessarily a perpendicular direction with respect to the surface of the structure) and etched features are formed in the structure. In the case of structures comprising single crystalline materials (e.g., single crystal Si), the material removal may proceed along a crystallographic direction of the single crystal, such as the <111>, <110> or <100> direction. Even without an applied magnetic field, material removal may proceed in a direction perpendicular to the surface of the structure or at an oblique angle with respect to the surface of the structure, depending on the orientation of the single crystal. By employing a programmable magnetic field as described herein, the direction of material removal (or etching direction) may be varied during etching and may be controlled as desired.

Typical etch times are from several seconds to several minutes. For example, the time duration of material removal may be from about 10 seconds to about 10 minutes. Generally, the time duration is from about 30 seconds to about 5 minutes, from about 30 seconds to about 3 minutes, or from about 1 minute to about 3 minutes. Nano- or microstructures having heights (depths) of up to tens of microns or up to hundreds of microns can be fabricated during etching. Besides the height of the etched features, the time duration of the MacEtch process may also influence the morphology of the etched structures. As described further in WO 2011/049804, which is hereby incorporated by reference in its entirety, sidewalls of the etched features may become rougher with increasing etching time.

In the case of chemical etching of semiconductors, material removal can be achieved through MacEtch with a varied etch rate and geometry regardless of the semiconductor doping type and level. The depth of the etched features may be controlled by etching time, as noted above. The generated holes ($h^+$) follow two different routes—they are either consumed right away by reacting with the semiconductor (e.g., silicon) in immediate proximity (resulting in the removal of the semiconductor directly in contact with the metal), or they diffuse out before the reaction (resulting in a porous region away from the metal). Thus, the final semiconductor nanostructure generated can be influenced by the type of metal catalyst (e.g., Ag, Au, Pt, Ti, or alloys thereof) employed for the magnetic pattern layer, the geometry of the magnetic pattern layer (e.g., metal catalyst feature size and spacing), the etchant concentration (e.g., $H_2O_2$/(HF+$H_2O_2$)), substrate doping type and level, and crystal orientation, along with the applied magnetic field.

Figure 8A:
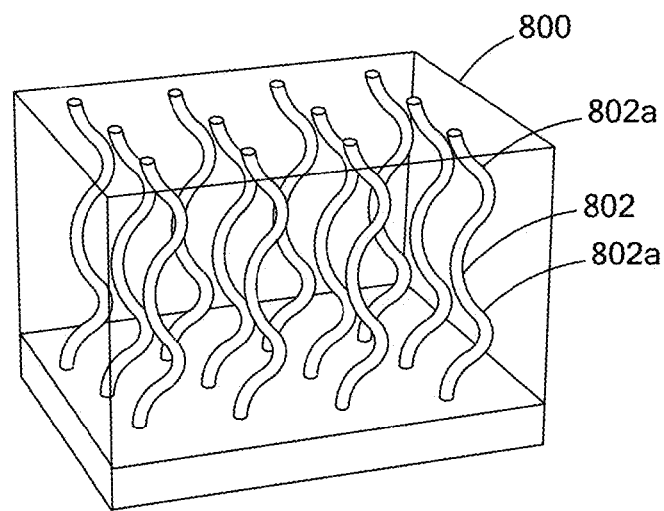
FIGS. 8A-8C show schematically the formation of spiral-shaped channels in a semiconducting structure via a MacEtch process (FIG. 8A), followed by deposition of an additional material into the spiral-shaped channels (FIG. 8B), and then selective removal of the original etched semiconducting structure to obtain an array of spiral structures comprising the additional material.
Figures 8B, 8C:
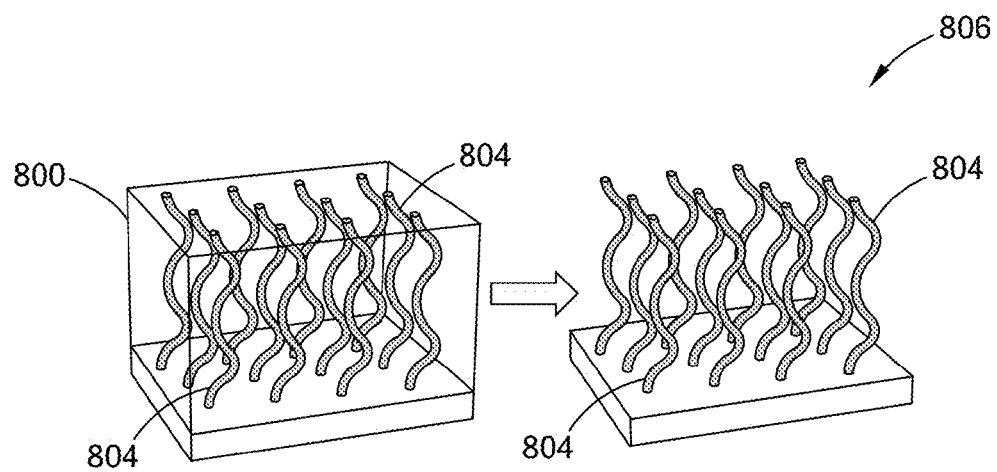

Unique microstructures not achievable with any other fabrication method may be produced using magnetic field-guide Mac Etch. An etched structure 800 made by the magnetic-field guided method described above may include channels 802 extending therethrough comprising one or more non-vertical portions 802a. For example, high aspect ratio non-vertical channels, spiral-shaped tunnels, and/or zigzag tunnels (e.g., see FIG. 8A) can be fabricated. Further processing can be carried out to form metal-dielectric metamaterials or active, nonlinear metamaterials by backfilling channels, tunnels or other open etched features with metallic and/or dielectric materials (e.g., active or nonlinear functional materials) 804 by physical vapor deposition (e.g., evaporation), electrochemical deposition, or another deposition method, as illustrated in FIG. 8B. After deposition of any additional material(s) 804, selective removal (e.g., by etching) of the original etched structure 800 may yield a completely reversed structure 806 comprising the additional material(s) 804, as shown in FIG. 8C for an exemplary array of helices comprising gold (Au). Such magnetic field-guided MacEtch processes may be employed to fabricate 3D functional optical metamaterials and other complex 3D structures.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:
1. A magnetic field-guided method of metal-assisted chemical etching, the method comprising:
immersing a structure in an etchant solution, the structure and the etchant solution being contained in an etching chamber surrounded by a three-dimensional configuration of electromagnets, the etching chamber defining an origin of x-, y- and z-axes and the structure comprising a two-dimensional magnetic pattern layer on a surface thereof, the magnetic pattern layer sinking into the structure as portions of the structure directly under the magnetic pattern layer are etched; and applying a programmable magnetic field $H(t) = \vec{H}_x(t) + \vec{H}_y(t) + \vec{H}_z(t)$ to the structure during etching to guide the sinking of the magnetic pattern layer, thereby controlling the etching of the structure in three dimensions, wherein the three-dimensional configuration of electromagnets comprises a first cage coil magnet assembly positioned inside a second cage coil magnet assembly having a larger diameter than the first cage coil magnet assembly, the first cage coil magnet assembly being radially positioned about the x-axis or the y-axis, and the second cage coil magnet assembly being radially positioned about the z-axis.

2. The magnetic-field guided method of claim 1, wherein the programmable magnetic field H(t) comprises a spatial variation of less than about 5% over the structure being etched.

3. The magnetic field-guided method of claim 1, wherein applying the programmable magnetic field H(t) comprises independently controlling the electric current supplied to the electromagnets.

4. The magnetic-field guided method of claim 1, wherein the magnetic pattern layer comprises a composite structure including a ferromagnetic material and a metal catalyst.

5. The magnetic-field guided method of claim 1, wherein, for a predetermined magnetic field distribution of the programmable magnetic field H(t), the magnetic pattern layer comprises, prior to applying the programmable magnetic field H(t), a predetermined spatial distribution of the ferromagnetic material, where regions of the magnetic pattern layer exposed to a lower magnetic field comprise a larger amount of the ferromagnetic material than regions of the magnetic pattern layer exposed to a higher magnetic field.

6. The magnetic-field guided method of claim 1, wherein the etchant solution contains an oxidizing agent and an acid.

7. The magnetic-field guided method of claim 1, wherein the structure comprises a semiconducting material.

8. An etched structure made by the magnetic-field guided method of claim 1, the etched structure comprising channels extending therethrough, the channels comprising one or more non-vertical portions.

9. The magnetic-field guided method of claim 1, wherein one or more of the electromagnets comprises a ferromagnetic core surrounded by at least about 100 turns of an electrically conductive wire.

10. The magnetic-field guided method of claim 1, wherein the three-dimensional configuration of electromagnets includes a first pair of electromagnets positioned on opposing sides of the etching chamber along the x-axis, a second pair of electromagnets positioned on opposing sides of the etching chamber along the y-axis, and a third pair of electromagnets positioned on opposing sides of the etching chamber along the z-axis.

11. The magnetic-field guided method of claim 1, wherein at least some of the electromagnets are part of a cage coil magnet assembly.

12. The magnetic-field guided method of claim 1, wherein the three-dimensional configuration of electromagnets comprises: a pair of electromagnets positioned on opposing sides of the etching chamber along one of the x-, y- and z-axes; and a cage coil magnet assembly radially positioned about the same axis.

13. The magnetic-field guided method of claim 1, wherein the etching chamber has a width of at least about ten times a width of the structure to be etched.

14. The magnetic-field guided method of claim 1, wherein each electromagnet has a width of at least about ten times a width of the structure to be etched.

* * * * *